United States Patent
Yu et al.

(10) Patent No.: US 10,225,946 B2
(45) Date of Patent: Mar. 5, 2019

(54) SERVER KIT CAPABLE OF SUPPORTING STORAGE DEVICES, SERVER SLIDE RAIL APPLIED TO SERVER KIT, AND RELATED SERVER SYSTEM

(71) Applicant: Wistron Corporation, New Taipei (TW)

(72) Inventors: Zhi-Tao Yu, New Taipei (TW);
Chong-Xing Zhu, New Taipei (TW);
Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 48 days.

(21) Appl. No.: 15/058,171

(22) Filed: Mar. 2, 2016

(65) Prior Publication Data

US 2017/0020023 A1    Jan. 19, 2017

(30) Foreign Application Priority Data

Jul. 14, 2015  (CN) .......................... 2015 1 0413125

(51) Int. Cl.
| | |
|---|---|
| *H05K 7/14* | (2006.01) |
| *A47B 96/06* | (2006.01) |
| *A47B 88/43* | (2017.01) |
| *A47B 88/493* | (2017.01) |

(52) U.S. Cl.
CPC .......... *H05K 7/1489* (2013.01); *A47B 88/43* (2017.01); *A47B 88/493* (2017.01)

(58) Field of Classification Search
CPC ...... H05K 7/1489; H05K 7/183; A47B 88/43; A47B 88/493; A47B 88/40; A47B 88/57
See application file for complete search history.

(56) References Cited

U.S. PATENT DOCUMENTS

| | | | | | |
|---|---|---|---|---|---|
| 6,142,590 | A | * | 11/2000 | Harwell | H05K 7/1494 312/208.1 |
| 6,398,041 | B1 | * | 6/2002 | Abbott | H02B 1/36 211/26 |
| 6,659,292 | B2 | * | 12/2003 | Gough | A47B 88/407 211/26 |
| 6,883,884 | B2 | * | 4/2005 | Chen | E05C 3/14 312/333 |

(Continued)

FOREIGN PATENT DOCUMENTS

| | | |
|---|---|---|
| TW | M403186 | 5/2011 |
| TW | M468864 | 12/2013 |

(Continued)

*Primary Examiner* — Kimberley S Wright
(74) *Attorney, Agent, or Firm* — Winston Hsu

(57) ABSTRACT

A server system capable of supporting a plurality of storage devices includes a rack, a server kit and a server slide rail. The server kit includes a holder and frame. The holder has a first zone and a second zone with different widths. The frame whereinside the storage devices are slidably assembled is disposed on the first zone. The server slide rail includes a rail supporting component, an external rail component and an internal rail component. The rail supporting component is disposed on the rack, and has a first part and a second part with different lengths. The external rail component is disposed on the second part and does not overlap the first part. The internal rail component is disposed on the second part and slidably assembled with the external rail component.

13 Claims, 8 Drawing Sheets

(56) References Cited

U.S. PATENT DOCUMENTS

| | | | | |
|---|---|---|---|---|
| 7,483,264 B2* | 1/2009 | Chen | G06F 1/181 | 312/223.1 |
| 7,780,254 B2* | 8/2010 | Wang | H05K 7/1489 | 108/143 |
| 8,028,965 B2* | 10/2011 | Chen | H05K 7/1489 | 248/298.1 |
| 8,127,940 B2* | 3/2012 | Henderson | H05K 7/1489 | 211/26 |
| 8,287,059 B2* | 10/2012 | Yang | H05K 7/1489 | 312/333 |
| 8,469,467 B2* | 6/2013 | Chang | H05K 7/1489 | 211/26 |
| 8,474,924 B2* | 7/2013 | Hsu | H05K 7/1489 | 211/26 |
| 8,562,086 B1* | 10/2013 | Baik et al. | H05K 7/1489 | 312/223.1 |
| 8,602,225 B2* | 12/2013 | Lin | A47B 88/43 | 211/26 |
| 8,931,860 B2* | 1/2015 | Fan | H05K 7/1489 | 248/222.12 |
| 8,964,371 B2* | 2/2015 | Hou | G11B 33/02 | 312/223.2 |
| 9,144,173 B2* | 9/2015 | Chen | H05K 7/1489 | |
| 9,237,671 B2* | 1/2016 | Chen | H05K 7/1489 | |
| 9,313,914 B2* | 4/2016 | Judge | H05K 7/1489 | |
| 9,370,120 B2* | 6/2016 | Chen | A47B 96/025 | |
| 9,474,182 B1* | 10/2016 | Chen | H05K 7/1489 | |
| 9,504,181 B2* | 11/2016 | Chen | H05K 7/1489 | |
| 9,532,478 B1* | 12/2016 | Good | H05K 7/14 | |
| 9,541,969 B2* | 1/2017 | Chen | H05K 7/1489 | |
| 9,635,942 B2* | 5/2017 | Chen | A47B 96/07 | |
| 9,717,333 B2* | 8/2017 | Chen | A47B 88/43 | |
| 9,723,746 B2* | 8/2017 | Chen | H05K 7/1489 | |
| 9,861,197 B2* | 1/2018 | Chen | A47B 88/43 | |
| 9,867,308 B2* | 1/2018 | Chen | H05K 7/1489 | |
| 9,872,414 B2* | 1/2018 | Eberle, Jr. | H05K 7/1489 | |
| 10,130,001 B2* | 11/2018 | Chen | H05K 7/183 | |
| 2004/0056572 A1* | 3/2004 | Chen | E05C 3/14 | 312/333 |
| 2004/0120106 A1* | 6/2004 | Searby | G06F 1/181 | 361/679.58 |
| 2004/0217073 A1* | 11/2004 | Dobler | H05K 7/1489 | 211/26 |
| 2006/0152115 A1* | 7/2006 | Dubon | A47B 88/43 | 312/334.8 |
| 2008/0073469 A1* | 3/2008 | Mushan | H05K 7/1489 | 248/205.1 |
| 2008/0122333 A1* | 5/2008 | Tseng | A47B 88/493 | 312/333 |
| 2008/0211366 A1* | 9/2008 | Brock | A47B 88/467 | 312/333 |
| 2009/0250421 A1* | 10/2009 | Wang | G06F 1/183 | 211/183 |
| 2009/0283652 A1* | 11/2009 | Chen | H05K 7/1489 | 248/298.1 |
| 2010/0140195 A1* | 6/2010 | Henderson | H05K 7/1489 | 211/13.1 |
| 2011/0100935 A1* | 5/2011 | Yang | H05K 7/1489 | 211/26 |
| 2011/0109213 A1* | 5/2011 | Wong | G02B 6/4455 | 312/334.7 |
| 2012/0120578 A1* | 5/2012 | Henderson | H05K 7/1489 | 361/679.02 |
| 2012/0292928 A1* | 11/2012 | Chang | H05K 7/1489 | 292/273 |
| 2012/0312943 A1* | 12/2012 | Fan | H05K 7/1489 | 248/222.11 |
| 2014/0021836 A1* | 1/2014 | Hou | G11B 33/02 | 312/223.2 |
| 2014/0111930 A1* | 4/2014 | Henderson | G06F 1/181 | 361/679.31 |
| 2014/0217049 A1* | 8/2014 | Chen | H05K 7/1489 | 211/195 |
| 2014/0226924 A1* | 8/2014 | Judge | H05K 7/1489 | 384/41 |
| 2014/0265788 A1* | 9/2014 | Judge | H05K 7/1489 | 312/334.1 |
| 2015/0048041 A1* | 2/2015 | Chuang | H05K 7/1489 | 211/175 |
| 2015/0362689 A1* | 12/2015 | Grandidge | H04Q 1/13 | 385/135 |
| 2015/0366092 A1* | 12/2015 | Grandidge | G02B 6/4452 | 312/223.6 |
| 2016/0073546 A1* | 3/2016 | Chen | H05K 7/1489 | 361/679.33 |
| 2016/0157610 A1* | 6/2016 | Chen | H05K 7/1489 | 248/219.3 |
| 2016/0262540 A1* | 9/2016 | Chen | H05K 7/1489 | |
| 2016/0278231 A1* | 9/2016 | Tsai | H05K 7/1487 | |
| 2016/0278232 A1* | 9/2016 | Chen | H05K 7/1489 | |
| 2016/0278234 A1* | 9/2016 | Chen | H05K 7/1489 | |
| 2016/0278522 A1* | 9/2016 | Chen | H05K 7/1489 | |
| 2016/0278525 A1* | 9/2016 | Chen | A47B 96/07 | |
| 2016/0286683 A1* | 9/2016 | Chen | H05K 7/1489 | |
| 2017/0095078 A1* | 4/2017 | Chen | H05K 7/1489 | |
| 2017/0112016 A1* | 4/2017 | Chen | A47B 88/044 | |
| 2017/0347480 A1* | 11/2017 | Bold | H05K 7/1489 | |

FOREIGN PATENT DOCUMENTS

| | | | | |
|---|---|---|---|---|
| TW | 201424513 | 6/2014 | | |
| WO | WO 2015065464 A1 * | 5/2015 | | H05K 7/1487 |

* cited by examiner

SERVER KIT CAPABLE OF SUPPORTING STORAGE DEVICES, SERVER SLIDE RAIL APPLIED TO SERVER KIT, AND RELATED SERVER SYSTEM

BACKGROUND OF THE DISCLOSURE

1. Field of the Disclosure

The present disclosure relates to a server system, and more particularly, to a server kit capable of simultaneously supporting a plurality of storage devices, a server slide rail applied to the foresaid server kit, and a server system composed of the server kit and the server slide rail.

2. Description of the Prior Art

Please refer to FIG. 1. FIG. 1 is a diagram of a server system 90 in the prior art. The conventional server system 90 includes a rack 92, slide rails 94 and a server holder 96. The rack 92 and the slide rails 94 have normal standards. Two slide rails 94 are fixed on the rack 92 and respectively assembled with sides of the serve holder 96, so the serve holder 96 can slide into or be removed from the rack 92 by the slide rails 94. A dimension of an entrance of the rack 92 equals 450 mm, and a thickness of the conventional slide rail 94 equals 6.4 mm. The server holder 96 has lots of storage devices, and a thickness of each storage device equals 74 mm. Therefore, a width of the server holder 96 cannot accommodate more than five storage devices side by side, or else a total width of six storage devices cannot pass through the entrance of the rack 92. However, it wastes mechanical space of the server holder 96 since there are only five storage devices arranged within the server holder 96 side by side, so the conventional server system 90 has drawbacks of low space utility and inferior expandability. Design of a new-typed server holder and a related slide rail capable of supporting more storage devices and being suitable for the normal-standards rack is an important issue in the mechanical design industry.

SUMMARY OF THE DISCLOSURE

The present disclosure provides a server kit capable of simultaneously supporting a plurality of storage devices, a server slide rail applied to the foresaid server kit, and a server system composed of the server kit and the server slide rail for solving above drawbacks.

According to the claimed disclosure, a server kit capable of simultaneously supporting a plurality of storage devices and slidably assembling with a rack is disclosed. The server kit includes a holder and a frame. The holder includes a first zone and a second zone adjacent by each other, and a width of the first zone is substantially greater than a width of the second zone. The frame is disposed on the first zone, and the plurality of storage devices is slidably disposed inside the frame.

According to the claimed disclosure, the holder further includes a bridging zone connected between the first zone and the second zone. The server kit further includes a strengthening component disposed on the bridging zone, and ends of the strengthening component are respectively connected with the first zone and the second zone.

According to the claimed disclosure, the server kit further includes an engaging component disposed on the first zone of the holder and adapted to detachably assemble with the rack.

According to the claimed disclosure, the server kit further includes a cover detachably disposed on the holder, an outline of the cover substantially corresponding to an outline of the holder.

According to the claimed disclosure, a server slide rail capable of slidably assembling a server kit with a rack is disclosed. A holder of the server kit has a first zone and a second zone adjacent by each other and with different widths. The server slide rail includes a rail supporting component, an external rail component and an internal rail component. The rail supporting component is disposed on the rack. The rail supporting component includes a first part and a second part adjacent by each other, and a length of the first part corresponds to a length of the first zone of the holder. The external rail component is disposed on the second part and not overlapped the first part. The internal rail component is disposed on the second zone of the holder and slidably assembling with the external rail component. The internal rail component is adapted to slide relative to the external rail component to overlap the first part.

According to the claimed disclosure, the rail supporting component further includes a bridging part, and the first part is connected to the second part via the bridging part in a dual-bending manner.

According to the claimed disclosure, the first zone of the holder is accommodated within a space formed by the first part bent from the second part of the rail supporting component while the internal rail component is located inside the second part and does not slide into the first part.

According to the claimed disclosure, the server slide rail further includes a first fixing component and a second fixing component. The first fixing component is fixed on the rack and disposed on the first part of the rail supporting component. A stretching portion is disposed on a bottom side of the first fixing component to support the first zone of the holder. The second fixing component is fixed on the rack and disposed on the second part of the rail supporting component.

According to the claimed disclosure, the server slide rail further includes a buckling component disposed on the first part of the rail supporting component and adapted to detachably assemble with an engaging component of the server kit.

According to the claimed disclosure, a server system capable of simultaneously supporting a plurality of storage devices is disclosed. The server system includes a rack, a server kit and a server slide rail. The server kit includes a holder and a frame. The holder includes a first zone and a second zone adjacent by each other, and a width of the first zone is substantially greater than a width of the second zone. The frame is disposed on the first zone, and the plurality of storage devices is slidably disposed inside the frame. The server slide rail is disposed between the rack and the server kit to slidably assemble the server kit with the rack. The server slide rail includes a rail supporting component, an external rail component and an internal rail component. The rail supporting component is disposed on the rack. The rail supporting component includes a first part and a second part adjacent by each other, and a length of the first part corresponds to a length of the first zone of the holder. The external rail component is disposed on the second part and not overlapped the first part. The internal rail component is disposed on the second zone of the holder and slidably assembling with the external rail component. The internal rail component is adapted to slide relative to the external rail component to overlap the first part.

According to the claimed disclosure, a sunken portion is formed on a bottom of the first zone of the holder, and the sunken portion is slidably supported by the stretching portion of the first fixing component.

The server system of the present disclosure designs the holder as a specific shape with the wide first zone and the narrow second zone, and structure of the server slide rail is designed according to the specific shape of the holder, so that six storage devices can be arranged inside the first zone of the holder side by side and the holder can be slidably assembled inside the rack via the server slide rail.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
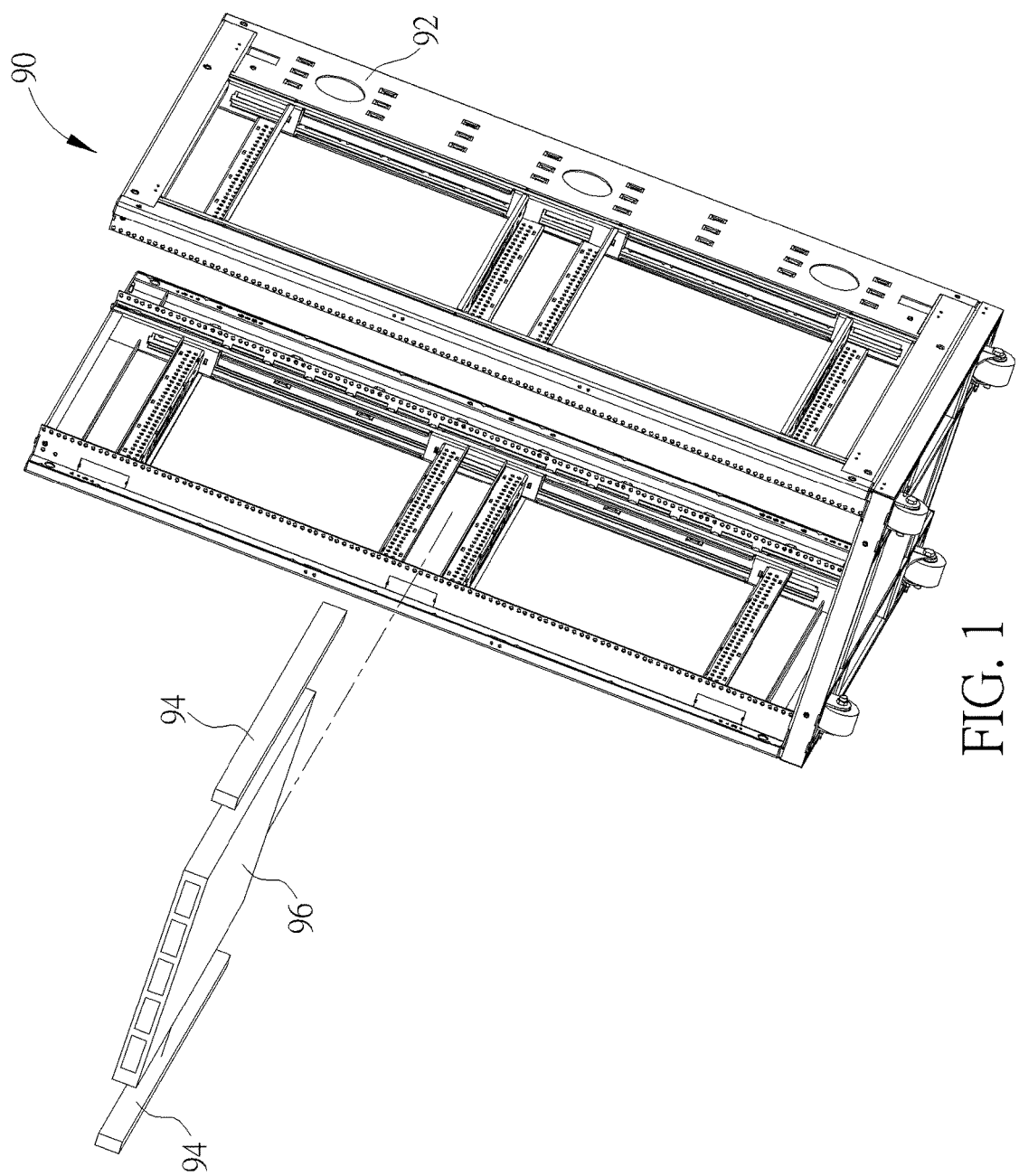
FIG. 1 is a diagram of a server system in the prior art.
Figure 2:
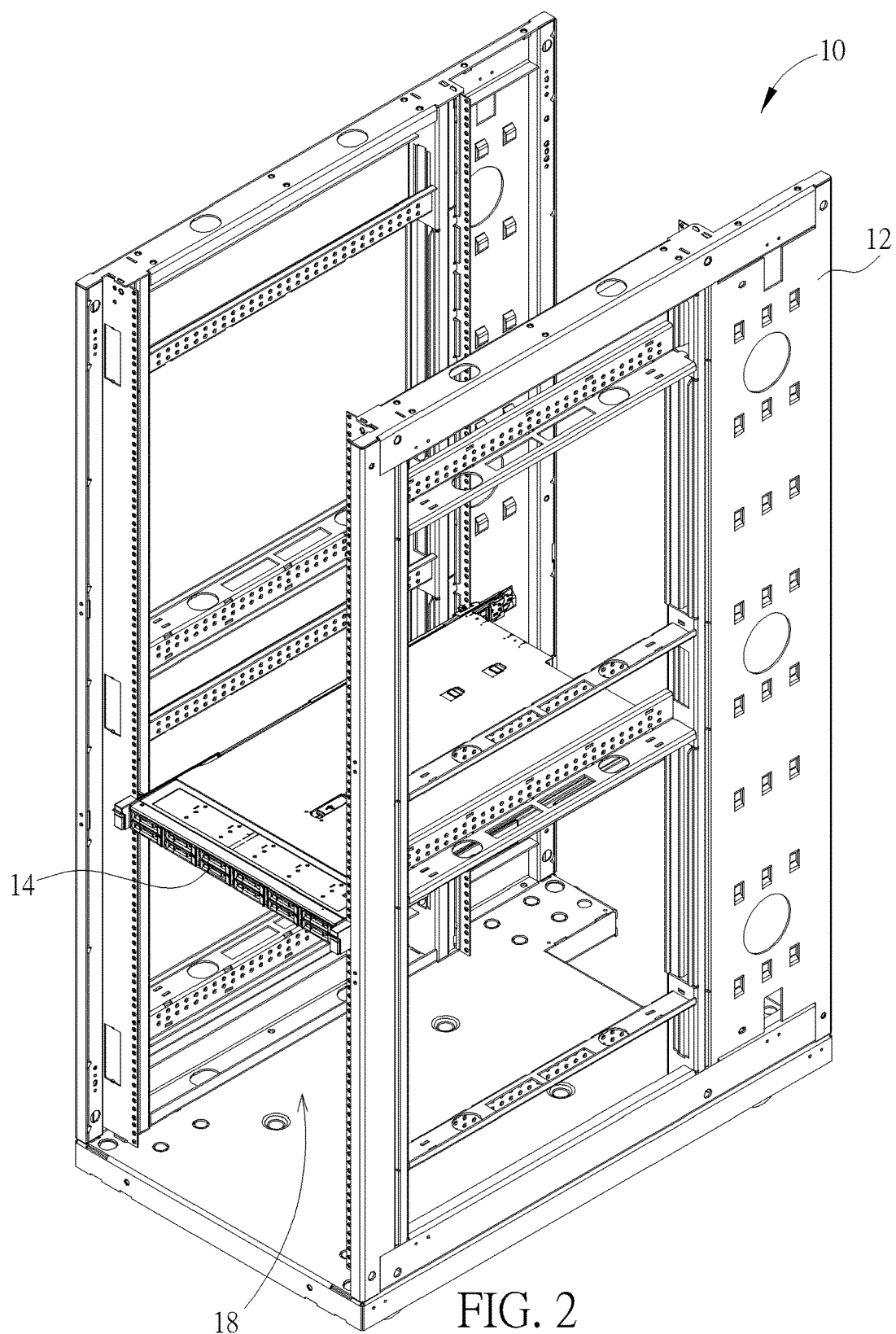
FIG. 2 and FIG. 3 respectively are diagrams of a server system in different operational modes according to an embodiment of the present disclosure.
Figure 3:
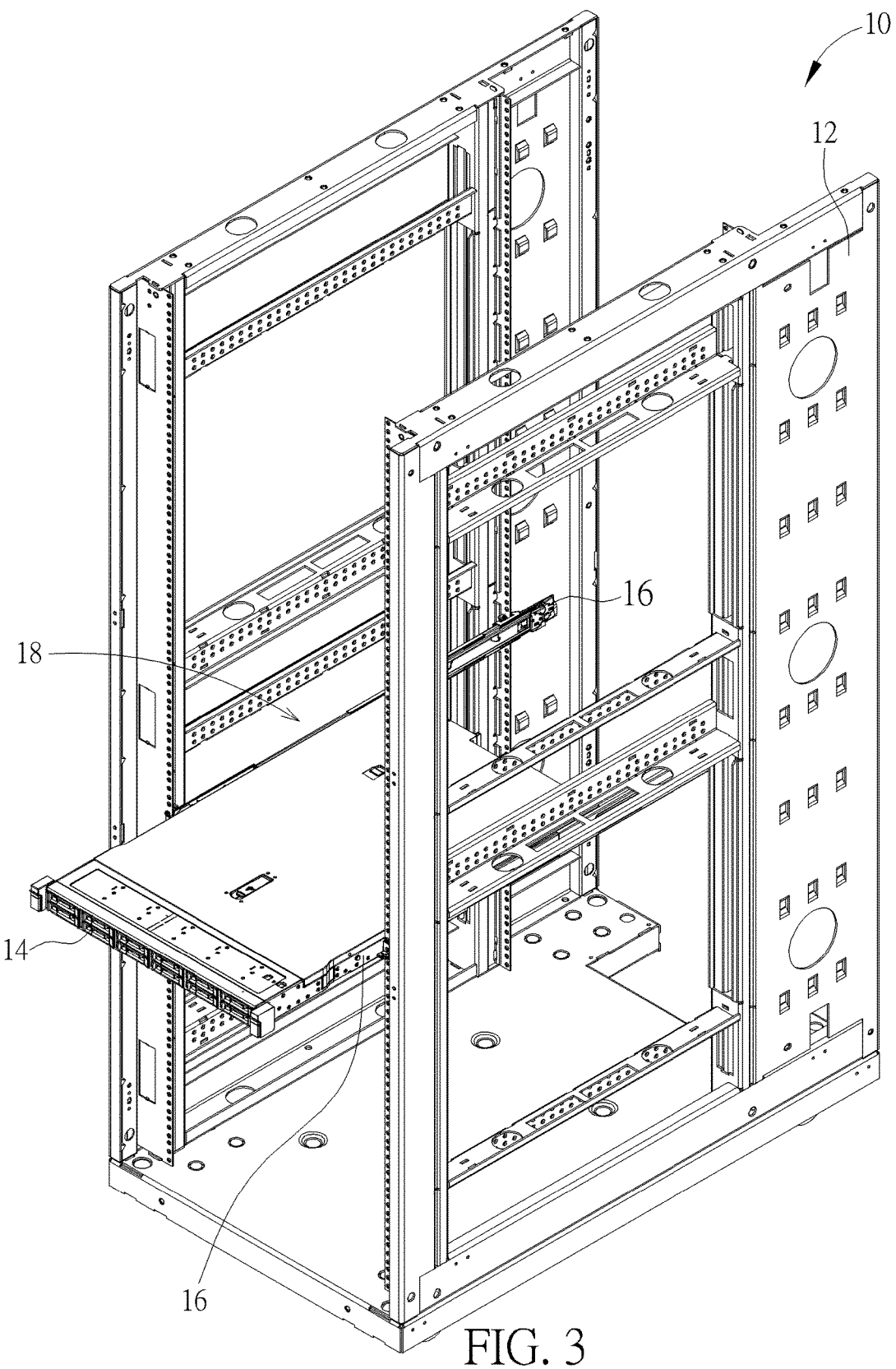

Please refer to FIG. 2 and FIG. 3. FIG. 2 and FIG. 3 respectively are diagrams of a server system 10 in different operational modes according to an embodiment of the present disclosure. The server system 10 includes a rack 12, a server kit 14 and a server slide rail 16. The server system 10 preferably disposes two server slide rails 16 respectively on opposite sides of the server kit 14, and the two server slide rails 16 are connected to the rack 12, so that the server kit 14 can be slidably assembled with rack 12. As shown in FIG. 2, the server slide rail 16 is sheltered by the rack 12 and the server kit 14, and cannot be viewed. As shown in FIG. 3, a part of the server kit 14 is moved out of the rack 12, and parts of the server slide rails 16 disposed on the sides of the server kit 14 are exposed accordingly. In addition, a front opening of the rack 12 is an entrance 18, the server kit 14 can be moved into or removed from the rack 12 through the entrance 18, and a plurality of electronic components on the server kit 14 can be conveniently assembled and disassembled. The plurality of electronic components preferably is (but not limited to) storage devices, such as hard disks.

Figure 4:
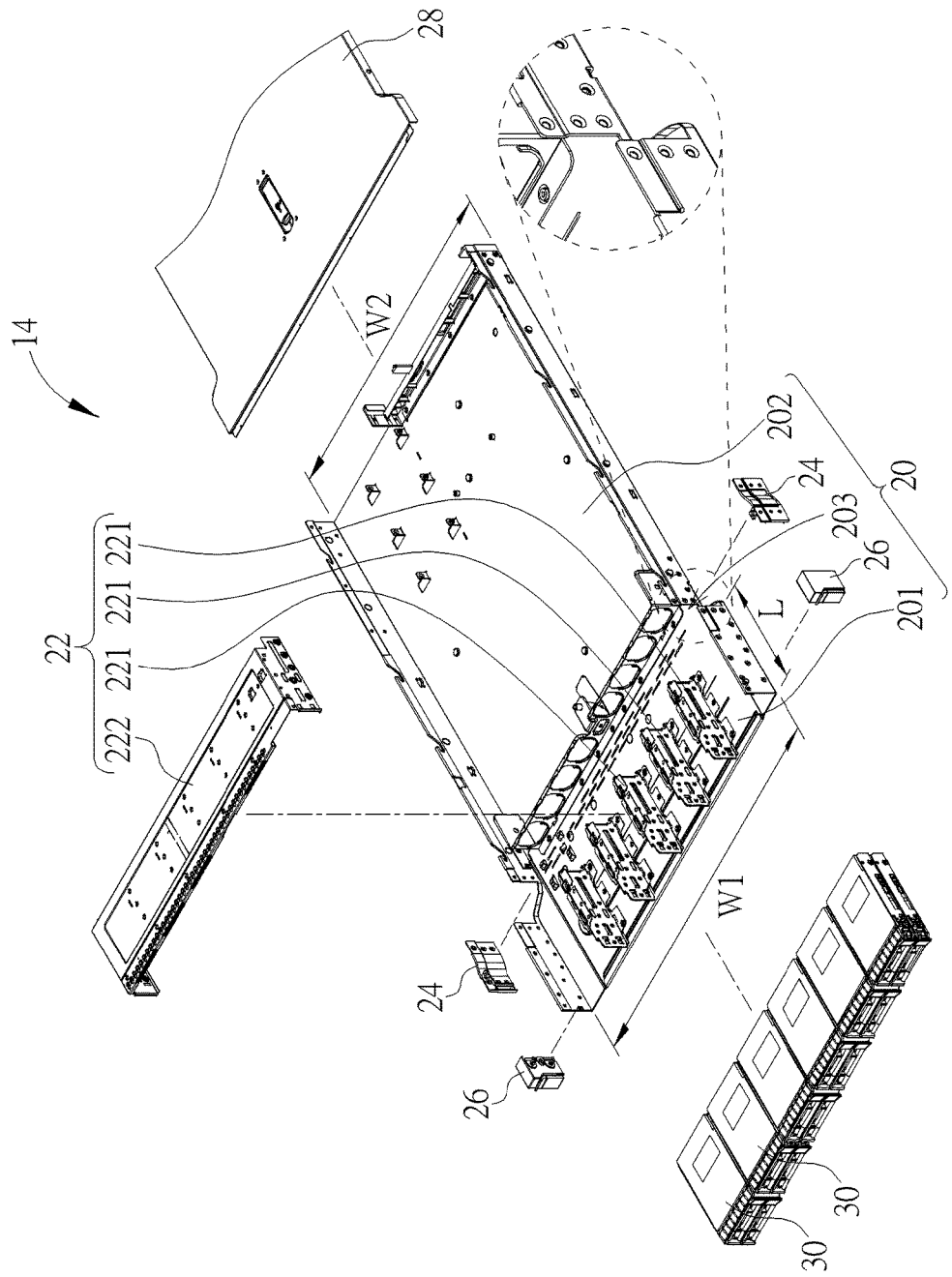
FIG. 4 is an exploded diagram of the server kit according to the embodiment of the present disclosure.

Please refer to FIG. 4. FIG. 4 is an exploded diagram of the server kit 14 according to the embodiment of the present disclosure. Assembly of the server kit 14 can be shown in FIG. 2 and FIG. 3. The server kit 14 includes a holder 20, a frame 22, a strengthening component 24, an engaging component 26 and a cover 28. The holder 20 includes a first zone 201, a second zone 202 and a bridging zone 203 adjacent by each other. The foresaid zones are monolithically integrated instead of being independently separated. A width W1 of the first zone 201 (which represents a transverse dimension of the first zone 201) corresponds to a dimension of the entrance 18; for example, the width W1 can be smaller than or equal to the dimension of the entrance 18. The width W1 of the first zone 201 is substantially greater than a width W2 of the second zone 202. The bridging zone 203 is connected between the first zone 201 and the second zone 202, and a width of the bridging zone 203 is set between the width W1 and the width W2. The strengthening component 24 is disposed on the bridging zone 203, two ends of the strengthening component 24 are respectively connected with lateral supporting portions of the first zone 201 and the second zone 202 (such as by rivet connection), and structural strength of the holder 20 can be effectively increased.

Figure 8:
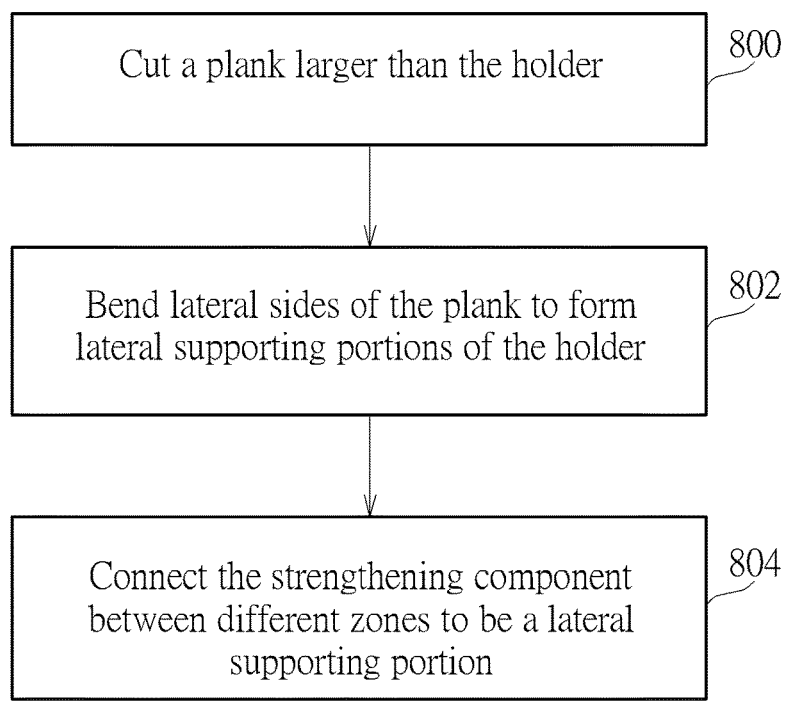
FIG. 8 is a flow chart of manufacturing a holder according to the embodiment of the present disclosure.

Manufacturing method of the holder 20 is illustrated in FIG. 4 and FIG. 8. FIG. 8 is a flow chart of manufacturing the holder 20 according to the embodiment of the present disclosure. First, step 800 is executed to cut a plank larger than the holder 20 from a metal motherboard according to a predetermined pattern. The predetermined pattern is composed of parts with different sizes. A wide part of the predetermined pattern corresponds to the first zone 201, a narrow part of the predetermined pattern corresponds to the second zone 202, and a part between the wide part and the narrow part corresponds to the bridging zone 203. Then, step 802 is executed that lateral sides of the wide part and the narrow part are bent as 90 degrees to form the lateral supporting portions of the holder 20. Final, step 804 is executed to connect the strengthening component 24 with the lateral supporting portions (which are the foresaid bent sides) of the first zone 201 and the second zone 202, to be the lateral supporting portion of the bridging zone 203.

The frame 22 optionally includes a plurality of blocking components 221 and a sheltering component 222. The plurality of blocking components 221 is fixed on the first zone 201 of the holder 20. The sheltering component 222 covers the blocking components 221 and is disposed on the lateral supporting portions of the first zone 201. Because the removable storage devices 30 of the present disclosure are slidably disposed inside the frame 22 instead of non-slidable design by screws or bolts, at least one blocking component 221 is set between the adjacent storage devices 30, and those storage devices 30 can be slidably loaded into the frame 22 by rails of the blocking component 221. Therefore, the width W1 of the first zone 201 is greater than a total dimensional sum of the removable storage devices 30 and those blocking components 221. In this embodiment, the frame 22 preferably includes five blocking components 221, and six storage devices 30 can be arranged within the frame 22 side by side. Amounts of the blocking component 221 and the storage device 30 are not limited to the above-mentioned embodiment, which depends on design demand.

The engaging component 26 can be any kind of hook disposed on the first zone 201 of the holder 20. The cover 28 is detachably disposed on the first zone 201 and the second zone 202 of the holder 20, which means an outline of the cover 28 is substantially equal to an outline of the holder 20. The cover 28 has a wide front end (which corresponds to the first zone 201) and a narrow rear end (which corresponds to the second zone 202), as shown in FIG. 4, so the holder 20 can be completely covered by the cover 28 for dust-proofing function.

Figure 5:
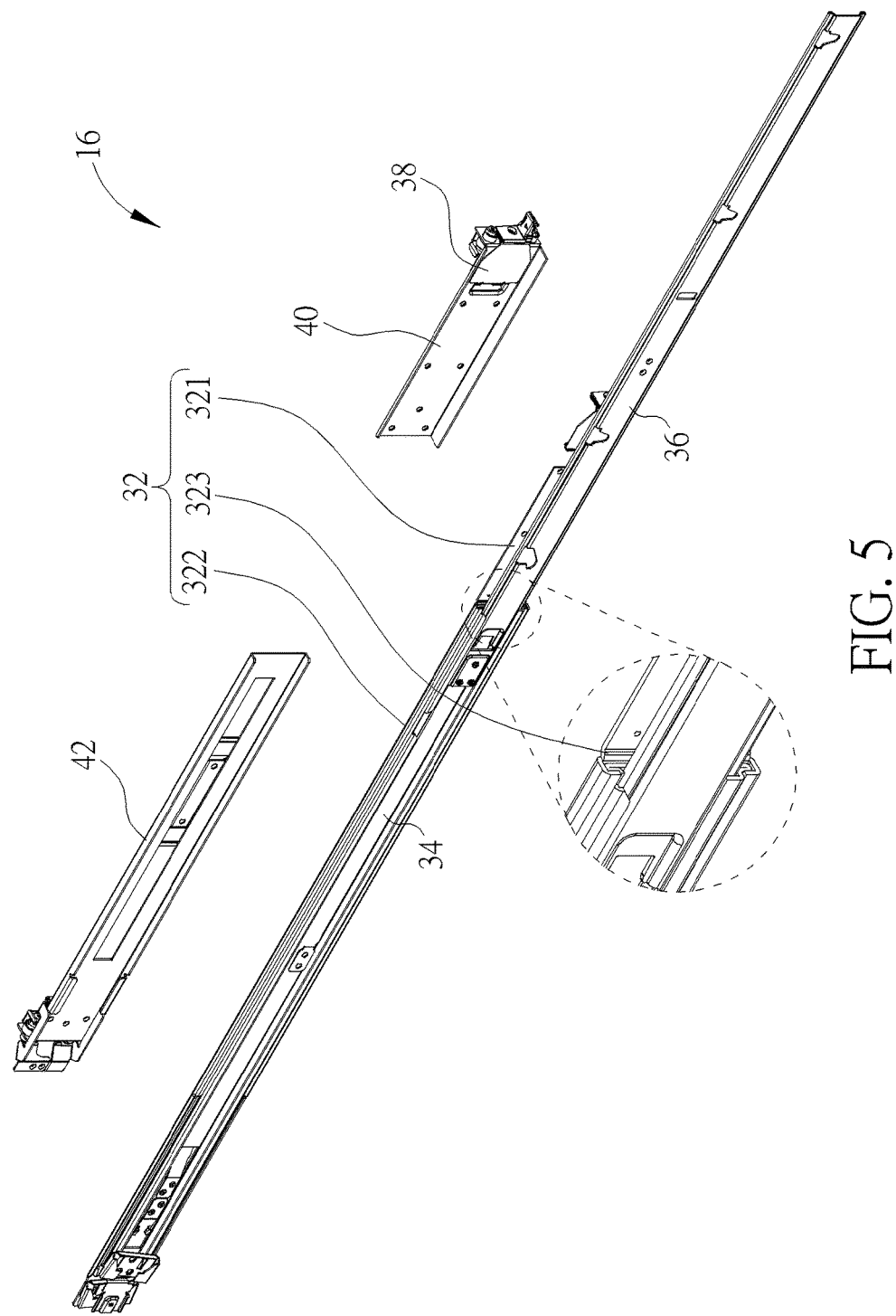
FIG. 5 is an exploded diagram of a server slide rail according to the embodiment of the present disclosure.
Figure 6:
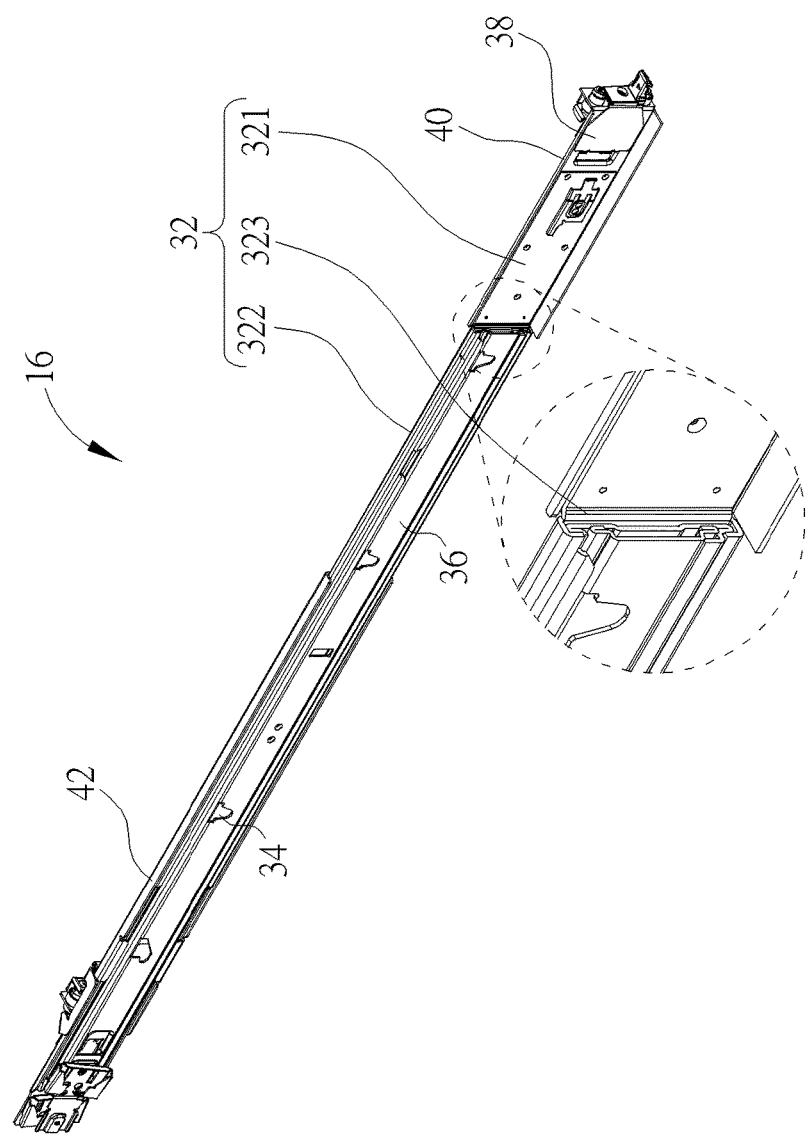
FIG. 6 is an assembly diagram of the server slide rail according to the embodiment of the present disclosure.

Please refer to FIG. 5 and FIG. 6. FIG. 5 is an exploded diagram of the server slide rail 16 according to the embodiment of the present disclosure. FIG. 6 is an assembly diagram of the server slide rail 16 according to the embodiment of the present disclosure. The server slide rail 16 includes a rail supporting component 32, an external rail component 34, an internal rail component 36, a buckling component 38, a first fixing component 40 and a second fixing component 42. The rail supporting component 32 includes a first part 321, a second part 322 and a bridging part 323 adjacent by each other. A length of the first part 321 substantially corresponds to a length L of the first zone 201 of the holder 20 (as shown in FIG. 4). Length of the second part 322 and the bridging part 323 may correspond to length of the second zone 202 and the bridging zone 203 of the holder 20 (not shown in figures). Besides, the first part 321 is connected to the second part 322 via the bridging part 323 in a dual-bending manner, which means the first part 321 is outward deformed according to the outline of the holder 20, and the holder 20 is not interfered with the rail supporting component 32 while the holder 20 moves relative to the server slide rail 16.

A shape of the rail supporting component 32 is designed according to the outline of the holder 20. The server slide rail 16 disposes the external rail component 34 on the second part 322 of the holder 20 and the external rail component 34 and the first part 321 are not overlapped. The server slide rail 16 further slidably assembles the internal rail component 36 with the external rail component 34, and the internal rail component 36 can move forward and backward between the first part 321 and the second part 322 of the holder 20. While the server kit 14 is located inside the rack 12, as the operational mode shown in FIG. 2, the internal rail component 36 is located within the second part 322 of the rail supporting component 32 and does not slide into the first part 321; in the meantime, the first zone 201 of the holder 20 is accommodated within a space formed by the first part 321 bent from the second part 322 of the rail supporting component 32. While the server kit 14 is partly removed out of the rack 12, as the operational mode shown in FIG. 3, the internal rail component 36 can slide relative to the external rail component 34 to partly overlap the first part 321 of the rail supporting component 32.

The buckling component 38 is disposed on the first part 321 of the rail supporting component 32, to detachably assemble with the engaging component 26 on the holder 20 for fixing the server kit 14 inside the rack 12 when the server kit 14 slides into the rack 12. Besides, the first fixing component 40 and the second fixing component 42 are respectively fixed on different positions of the rack 12, and respectively disposed on the first part 321 and the second part 322 of the rail supporting component 32. A stretching portion 44 is disposed on a bottom side of the first fixing component 40. The server slide rail 16 not only assembles the internal rail component 36 with the second zone 202 of the holder 20 for providing support, but also utilizes the stretching portion 44 of the first fixing component 40 to support the first zone 201 of the holder 20, so the server kit 14 can be slidably disposed on the server slide rail 16 in a stable manner.

Figure 7:
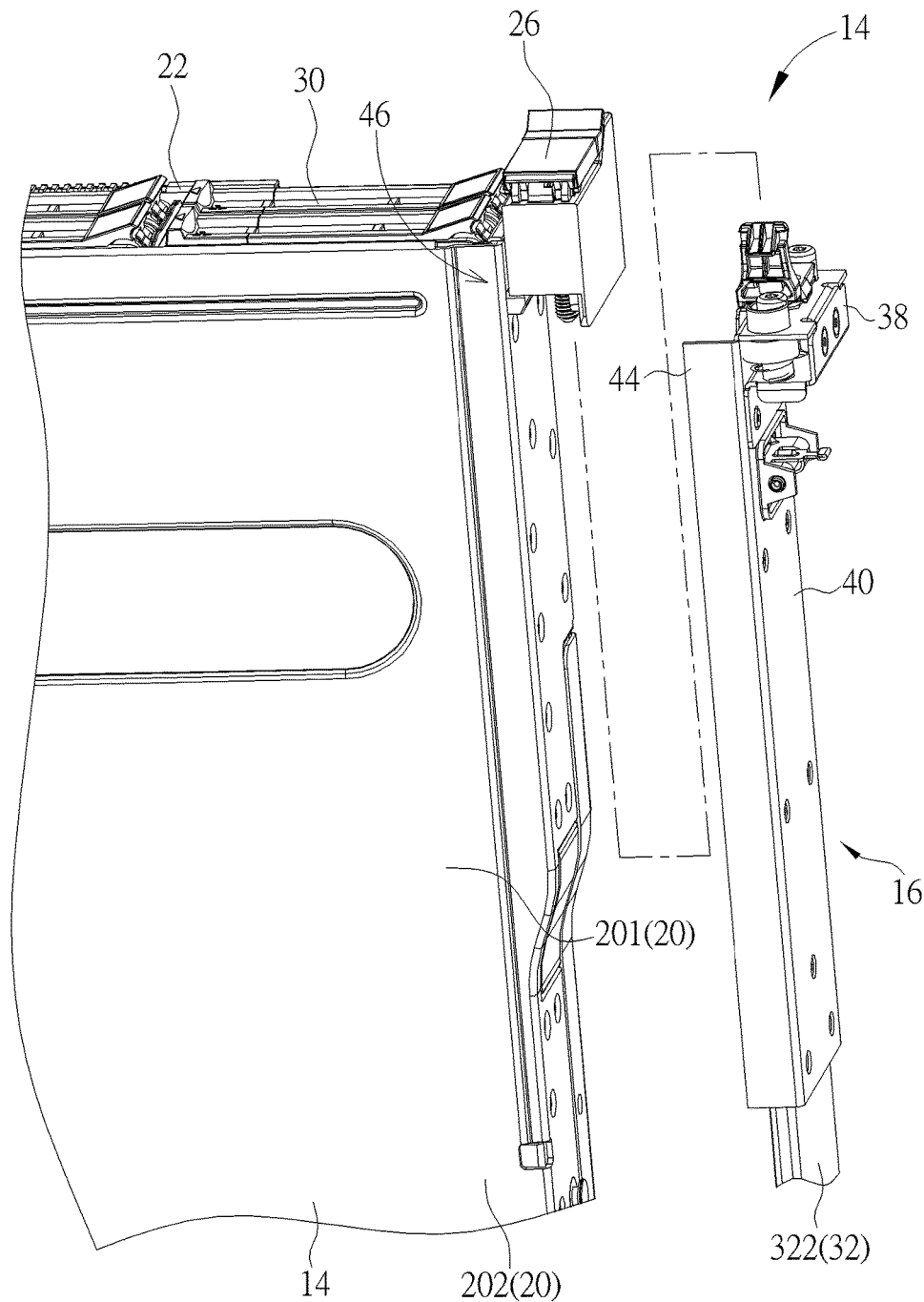
FIG. 7 is a partial diagram of the server kit and the server slide rail according to the embodiment of the present disclosure.

Please refer to FIG. 7. FIG. 7 is a partial diagram of the server kit 14 and the server slide rail 16 according to the embodiment of the present disclosure. A sunken portion 46 (as the dotted portion shown in FIG. 7) is formed on a bottom of the first zone 201 of the holder 20, and the sunken portion 46 is slidably supported by the stretching portion 44 of the first fixing component 40. The storage device 30 is disposed on the first zone 201 of the holder 20. The plurality of electronic components (such as the main board, the central processing unit and/or the thermal fan) is mainly disposed on the second zone 202 of the holder 20. Dimensions of the second zone 202 is greater than dimensions of the first zone 201, structural gravity center of the holder 20 is usually located on the second zone 202. The second zone 202 of the holder 20 is supported by the internal rail component 36 (as described in FIG. 5 and FIG. 6). Counterweight of the electronic components on the holder 20 can be ignored since the stretching portion 44 is applied to support the sunken portion 46 of the first zone 201 and the gravity center of the holder 20 keeps within a range of the second part 322 of the rail supporting component 32 (which means the gravity center of the holder 20 is moved inside the external rail component 34), so as to ensure that the server kit 14 is not toppled over the server slide rail 16.

Generally, the rack 12 has normal standards and dimension of the entrance 18 equals 450 mm, the storage device 30 has normal standards and its width equals 74 mm. A conventional slide rail applied to the server kit 14 is composed of several units and its thickness is not smaller than 6.4 mm or else cannot provide sufficient structural strength. The server system 10 of the present disclosure arranges six storage devices 30 inside the server kit 14 side by side to form a storage device set (several storage device sets can be stacked up for expansion, actual embodiment depends on user's demand and a detailed description is omitted herein for simplicity), and the storage device set with the six storage devices 30 is slidably assembled with the holder 20 via the frame 22. That is, a total width including the six storage devices 30, the frame 22 and two conventional slide rails (disposed on sides of the server kit 14) is greater than the dimension of the entrance 18), so the conventional server system allows five (or less) storage devices disposed inside each storage device set, space of the rack 12 cannot be effectively applied to the excess storage devices.

For overcoming the foresaid drawback, as shown in FIG. 4, the server system 10 of the present disclosure divides the holder 20 of the server kit 14 into two zones 201, 202. The width W1 of the first zone 201 is increased to arrange six storage devices 30 side by side, the width W2 of the second zone 202 is smaller than the width W1 (for instance, the width W2 can be maintained as conventional dimensions). Accordingly, the external rail component 34 and the internal rail component 36 of the server slide rail 16 are disposed on the second zone 202 of the holder 20 (and further on the related rack 12), the total width of the second zone 202 and the two server slide rails 16 is smaller than the dimension of the entrance 18. It should be mentioned that the server slide rail 16 only disposes the first fixing component 40 and the first part 321 of the rail supporting component 32 on position corresponding to the first zone 201 of the holder 20. The external rail component 34 and the internal rail component 36 are not disposed on a part of the server slide rails 16 corresponding to the first zone 201 of the holder 20, and the total width of the first zone 201 of the holder 20 and the first part 321 of the rail supporting component 32 is smaller than the dimension of the entrance 18.

Comparing to the prior art, the server system 10 of the present disclosure designs the holder 20 as a specific shape with the wide first zone 201 and the narrow second zone 202, and structure of the server slide rail 16 is designed according to the specific shape of the holder 20, so that six storage devices 30 can be arranged inside the first zone 201 of the holder 20 side by side and the holder 20 can be slidably assembled inside the rack 12 via the server slide rail 16.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A server slide rail capable of slidably assembling a server kit with a rack, a holder of the server kit having a first zone and a second zone adjacent by each other and with different widths, the server slide rail comprising:
    two rail supporting components disposed on the rack, each rail supporting component comprising a first part and a second part adjacent by each other and arranged along a sliding direction of the rail supporting component, a length of the first part corresponding to a length of the first zone of the holder, wherein a distance between lateral sides of the first zone is greater than a distance between second parts of the two rail supporting components, the rail supporting component further comprises a bridging part, and the first part is connected to the second part via the bridging part in a dual-bending manner;
    two external rail components disposed on the corresponding second part and not overlapped the first part; and
    two internal rail components disposed on the second zone of the holder and slidably assembling with the corresponding external rail component, each internal rail component being adapted to slide relative to the corresponding external rail component from a position overlapping the second part and not overlapping the first part to a position overlapping the first part and the second part.

2. The server slide rail of claim 1, wherein the first zone of the holder is accommodated within a space formed by the first part bent from the second part of the rail supporting component while the internal rail component is located inside the second part and does not slide into the first part.

3. The server slide rail of claim 1, further comprising:
    a first fixing component fixed on the rack and disposed on the first part of the rail supporting component, a stretching portion being disposed on a bottom side of the first fixing component to support the first zone of the holder; and
    a second fixing component fixed on the rack and disposed on the second part of the rail supporting component.

4. A server system capable of simultaneously supporting a plurality of storage devices, the server system comprising:
    a rack;
    a server kit, comprising:
        a holder, comprising a first zone and a second zone adjacent by each other, a width of the first zone being substantially greater than a width of the second zone; and
        a frame disposed on the first zone, the plurality of storage devices being slidably disposed inside the frame; and
        a strengthening component, opposite ends of the strengthening component being respectively disposed on the first zone and the second zone; and
    a server slide rail disposed between the rack and the server kit to slidably assemble the server kit with the rack, the server slide rail comprising:
        two rail supporting components disposed on the rack, each rail supporting component comprising a first part and a second part adjacent by each other and arranged along a sliding direction of the rail supporting component, a length of the first part substantially corresponding to a length of the first zone of the holder, wherein a distance between lateral sides of the first zone is greater than a distance between second parts of the two rail supporting components;
        two external rail components disposed on the corresponding second part and not overlapped the first part; and
        two internal rail components disposed on the second zone of the holder and slidably assembled with the corresponding external rail component, each internal rail component being adapted to slide relative to the corresponding external rail component from a position overlapping the second part and not overlapping the first part to a position overlapping the first part and the second part.

5. The server system of claim 4, wherein the holder further comprises a bridging zone connected between the first zone and the second zone, and the strengthening component is disposed on the bridging zone.

6. The server system of claim 4, wherein the server kit further comprises an engaging component disposed on the first zone of the holder, the server slide rail further comprises a buckling component disposed on the first part of the rail supporting component to detachably assemble with the engaging component.

7. The server system of claim 4, wherein the server kit further comprises a cover detachably disposed on the holder, and an outline of the cover substantially corresponds to an outline of the holder.

8. The server system of claim 4, wherein the rail supporting component further comprises a bridging part, the first part is connected to the second part via the bridging part in a dual-bending manner.

9. The server system of claim 4, wherein the first zone of the holder is accommodated within a space formed by the first part bent from the second part of the rail supporting component while the internal rail component is located inside the second part and does not slide into the first part.

10. The server system of claim 4, wherein the server slide rail further comprises:
    a first fixing component fixed on the rack and disposed on the first part of the rail supporting component, a stretching portion being disposed on a bottom side of the first fixing component to support the first zone of the holder; and
    a second fixing component fixed on the rack and disposed on the second part of the rail supporting component.

11. The server system of claim 10, wherein a sunken portion is formed on a bottom of the first zone of the holder, and the sunken portion is slidably supported by the stretching portion of the first fixing component.

12. The server system of claim 4, wherein the foresaid storage device is a hard disk.

13. The server slide rail of claim 1, further comprising:
    a buckling component disposed on the first part of at least one of the rail supporting component and adapted to detachably assemble with an engaging component of the server kit.

* * * * *